United States Patent [19]

Tsoi

[11] Patent Number: 5,273,922
[45] Date of Patent: Dec. 28, 1993

[54] HIGH SPEED, LOW GATE/DRAIN CAPACITANCE DMOS DEVICE

[75] Inventor: Hak-Yam Tsoi, Scottsdale, Ariz.
[73] Assignee: Motorola, Inc., Schaumburg, Ill.
[21] Appl. No.: 943,651
[22] Filed: Sep. 11, 1992
[51] Int. Cl.[5] .......................................... H01L 21/336
[52] U.S. Cl. ...................................... 437/41; 437/150; 437/157; 148/DIG. 126; 257/335
[58] Field of Search ................ 437/27, 28, 29, 30, 437/41, 44, 157, 158, 150, 151, 41; 257/335, 340, 341; 148/DIG. 126

[56] References Cited

U.S. PATENT DOCUMENTS

| | | | |
|---|---|---|---|
| 3,821,776 | 6/1972 | Hayashi et al. | 257/340 |
| 4,810,664 | 3/1989 | Kamins et al. | 437/26 |
| 4,987,093 | 1/1991 | Teng et al. | 437/28 |
| 5,047,820 | 9/1991 | Garnett | 257/339 |
| 5,121,176 | 6/1992 | Quigg | 257/340 |
| 5,158,901 | 10/1992 | Kosa et al. | 437/29 |

FOREIGN PATENT DOCUMENTS 2-5434  1/1990  Japan .................................. 437/41

Primary Examiner—Olik Chaudhuri
Assistant Examiner—David Mason
Attorney, Agent, or Firm—Eugene A. Parsons

[57] ABSTRACT

A DMOS device with field oxide formed in the channel between adjacent transistors and an impurity implanted through the same opening in which the field oxide is formed. The gate is deposited over the field oxide and spaced from the supporting epitaxial layer by the field oxide to reduce the gate-to-drain capacitance. The implanted impurity below the field oxide reduces ON resistance of the device.

7 Claims, 3 Drawing Sheets

HIGH SPEED, LOW GATE/DRAIN CAPACITANCE DMOS DEVICE

The present invention pertains to double diffused metal oxide semiconductor devices and more specifically to high speed vertical double diffused metal oxide semiconductor devices in which the gate to drain capacitance and the ON resistance are substantially reduced.

BACKGROUND OF THE INVENTION

In general, vertical double diffused metal oxide semiconductor (DMOS) devices have a gate spaced from the active junction by a layer of gate oxide approximately 500–1000 angstroms thick. Because the gate is very close to the active junction and the channel, or drain, of the device, a relatively large capacitance, $C_{GD}$, is formed between the gate and the drain of the device. This capacitance acts as a negative feedback path and limits the speed of switching of the device.

Further, in higher voltage vertical DMOS devices an epitaxial layer on the substrate in which the devices are formed is relatively lightly doped. This lightly doped region in the conductive path of the device increases the resistance of the device in the ON mode.

SUMMARY OF THE INVENTION

It is a purpose of the present invention to provide a new and improved method of producing high speed, low gate/drain capacitance DMOS devices.

It is a further purpose of the present invention to provide a new and improved method of producing high speed, low gate/drain capacitance DMOS devices with low ON resistance.

These and other purposes and advantages are realized in a method of producing high speed, low gate/drain capacitance DMOS devices, including the steps of providing a substrate forming a first layer of material having a first conductivity type on a surface of the substrate, diffusing first and second spaced apart areas of a second conductivity type, different than the first conductivity type, into the first layer, diffusing first and second spaced apart areas of the first conductivity type into the first and second areas of the second conductivity type, forming a relatively thick layer of insulating material on the first layer of material between the first and second spaced apart areas of the second conductivity type, forming a relatively thin layer of insulating material over the relatively thick layer of insulating material, the first and second spaced apart areas of the second conductivity type and the first and second spaced apart areas of the first conductivity type, and forming a gate layer over the relatively thin layer of insulating material in overlying relationship to the relatively thick layer of insulating material, a portion of the first and second spaced apart areas of the second conductivity type and a portion of the first and second spaced apart areas of the first conductivity type.

BRIEF DESCRIPTION OF THE DRAWINGS

Referring to the drawings.

DESCRIPTION OF THE PREFERRED EMBODIMENT

Figure 1:
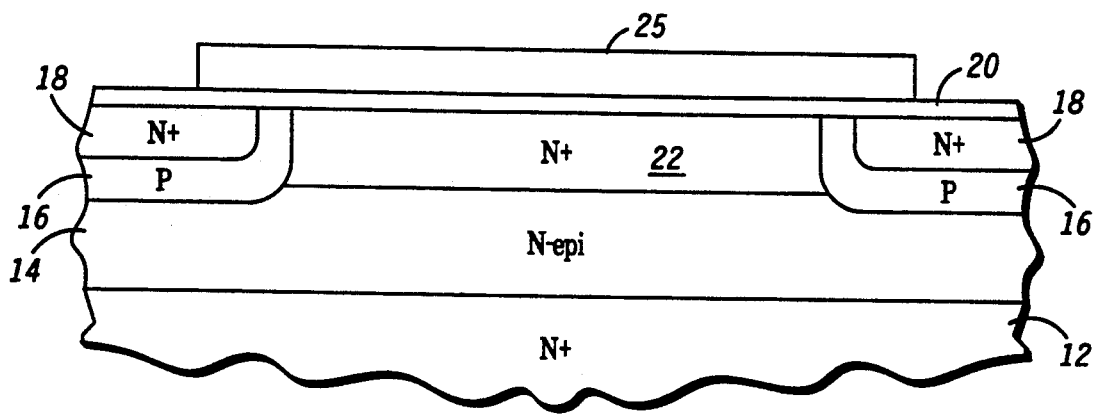
FIG. 1 is a cross sectional view of a prior art DMOS device.

Referring specifically to FIG. 1, a cross sectional view of a prior art DMOS device 10 is illustrated. Device 10 is formed on a silicon substrate 12 which is relatively heavily doped to produce N type conductivity. An epitaxial layer 14 is grown on the surface of substrate 12 and is lightly doped to produce N type conductivity. P type conductivity tubs 16 are diffused into epitaxial layer 14 and heavily doped N type conductivity 18 is diffused into tubs 16 to form N-P-N junctions in epitaxial layer 14. The area 22 between tubs 16 from the surface of epitaxial layer 14 to a depth less than the depth of tubs 16 is heavily doped to reduce the resistance of the final device in the ON mode. Finally, a very thin layer 20 of gate oxide is grown over the entire surface of epitaxial layer 14 and a gate 25 is deposited on layer 20 in overlying relationship to portions of tubs 16, portions of conductivity 18 and area 22.

Figure 2:
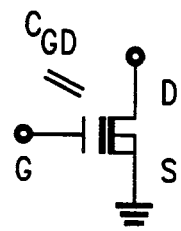
FIG. 2 is a schematic depiction of a DMOS device.

Referring specifically to FIG. 2, a schematic representation of a DMOS device, which in this instance is a field effect transistor (FET). The DMOS device includes a source electrode labelled S, a drain electrode labelled D and a gate electrode labelled G. As is well known in the art and as can be seen from the schematic depiction of FIG. 2, a capacitance $C_{GD}$ is present between drain electrode D and gate electrode G. Capacitance $C_{GD}$ provides feedback from drain electrode D to gate electrode G which limits the switching speed of the DMOS device. In DMOS device 10 of FIG. 1, layer 20 is on the order of 500–1000 angstroms thick so that gate 25 is very close to the drain, or channel 22. Capacitance $C_{GD}$ is primarily produced by conductive gate 25 and heavily doped conductive area 22 with insulating layer 20 therebetween. In DMOS device 10 capacitance $C_{GD}$ is relatively large and the speed of DMOS device 10 is severely limited.

Figure 3:
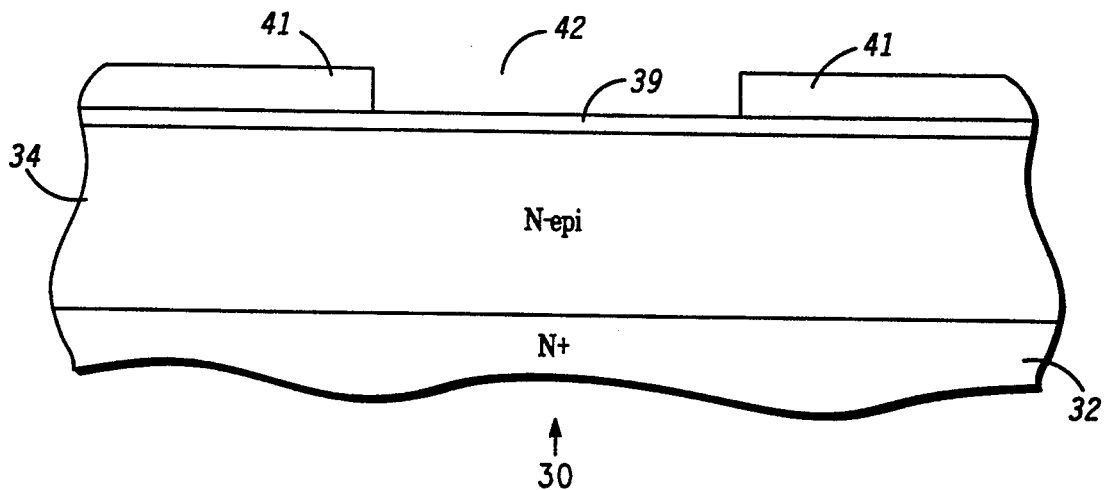
FIGS. 3–6 are cross sectional views illustrating various steps in the manufacture of a DMOS device in accordance with the present invention.

FIGS. 3–6 are cross sectional views illustrating various steps in the manufacture of a DMOS device 30 in accordance with the present invention. Referring specifically to FIG. 3, a substrate 32 is heavily doped with N type conductivity impurities and an epitaxial layer 34 is grown on the surface thereof. Epitaxial layer 34 is relatively lightly doped to provide for higher breakdown voltages.

A thin protective layer 39 of oxide is grown on the surface of epitaxial layer 34 and is generally retained throughout the procedures described thus far. A layer 41 of silicon nitride is deposited over layer 39 and patterned by any convenient means, such as well known photoresist and etch processes, to define an opening 42 therethrough. In this particular embodiment layer 41 is formed approximately 1400 angstroms thick so that it masks everything but opening 42 during subsequent process steps.

Figure 4:
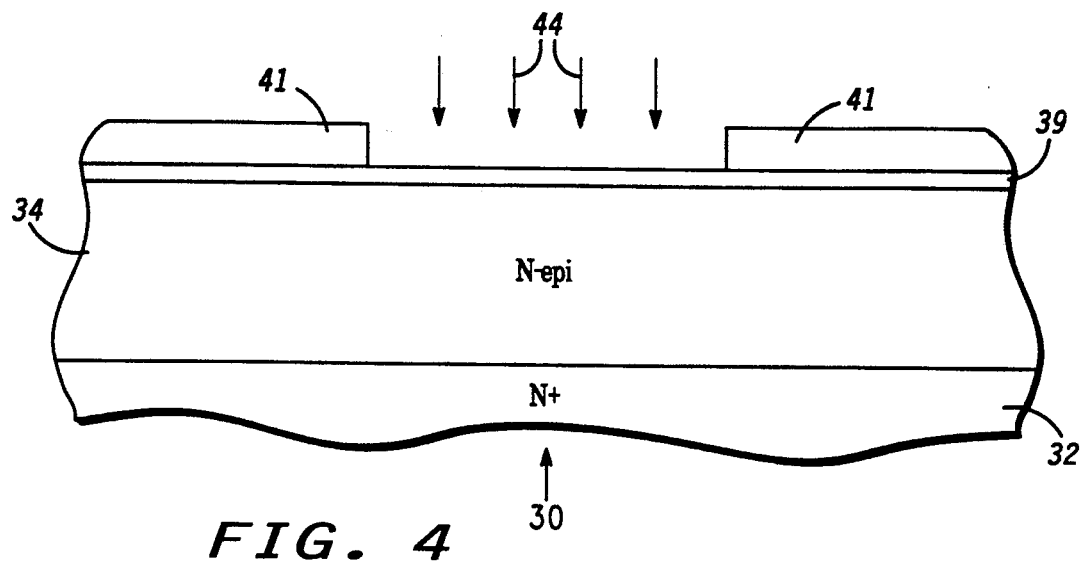

Referring specifically to FIG. 4, the structure of FIG. 3 is illustrated with an impurity or dopant being implanted, represented by arrows 44, into epitaxial layer 34 through opening 42. Implant 44 may be diffused by a specific diffusion step or by subsequent process steps.

Figure 5:
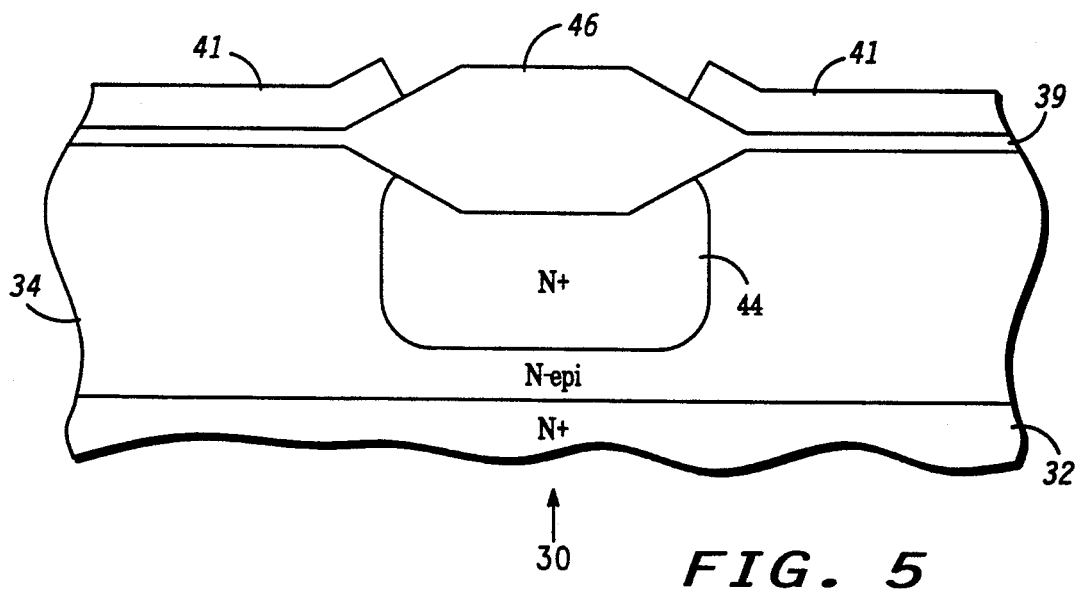

Referring specifically to FIG. 5, the structure of FIG. 4 is illustrated with the next step in the process performed. A relatively thick layer 46 of insulating material, which in this specific embodiment is a field oxide, is grown in opening 42 on the surface of epitaxial layer 34. Layer 46 is at least 1000 angstroms thick and can be as much as 10,000 angstroms thick. In this specific embodiment layer 46 is approximately 5000 angstroms thick. Diffused implant 44 is positioned directly below layer 46. Thus, implant 44 is self aligned and implant 44 and relatively thick layer 46 are both formed by using opening 42 and no additional masking steps are required.

Figure 6:
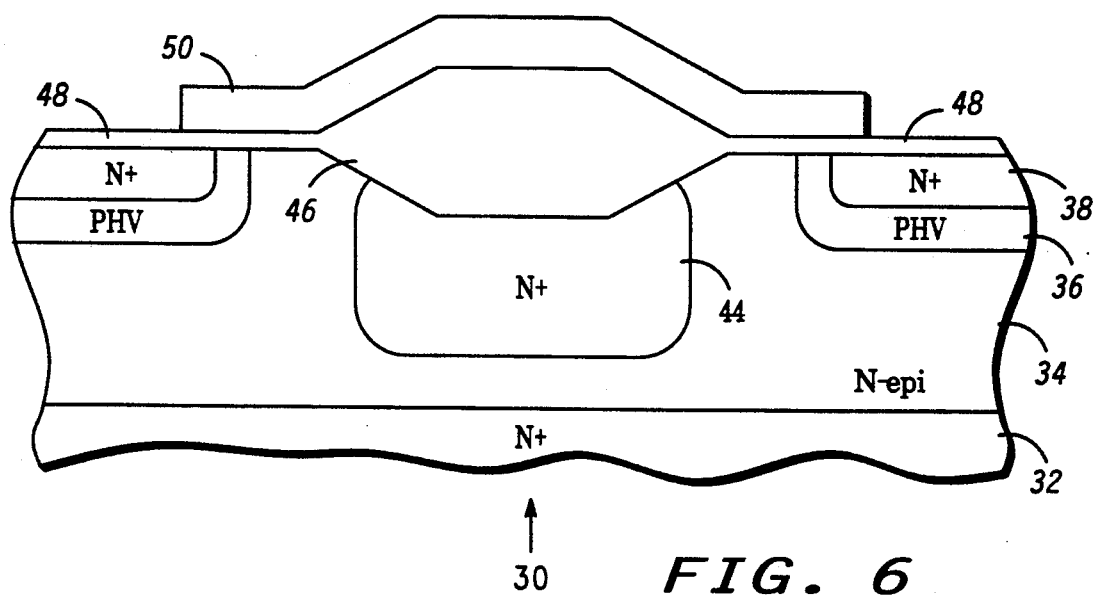

Referring specifically to FIG. 6, the structure of FIG. 5 is illustrated with layers 41 and 39 removed and a layer 48 of gate oxide grown over the entire surface of epitaxial layer 34, including layer 46. While gate oxide growth will have relatively little effect on layer 46, it is included only so it will be understood that no masking or other steps are utilized. Once layer 48 is grown, a gate 50 is deposited on the surface of layer 48 in partially overlying relationship to layer 46.

After gate layer 50 is formed, first and second spaced apart areas 36 of a P type conductivity are implanted and diffused into epitaxial layer 34 using layer 46 and gate layer 50 as a mask. Areas 36 are relatively lightly doped to form the channel of DMOS device 30, hence the designation PHV. First and second relatively heavily doped areas 38 of N type conductivity are implanted and diffused in first and second areas 36, respectively. Each of areas 38, in conjunction with the associated area 36 and epitaxial layer 34 form an N-P-N junction.

It should be understood that the structure illustrated in FIG. 6 is only a small part of the complete device and, if viewed from the top, would appear as a plurality of cells (extending into FIG. 6). FIG. 6 illustrates approximately one half of a left cell and one half of a right cell with the broken away halves being mirror images of the portions illustrated. Further, first and second areas 36 with first and second areas 38 implanted therein and the or portion of epitaxial layer 34 defined therebetween, each form one half of two separate transistors, the broken away portions of the cells being the other half.

Because gate 50 is spaced from epitaxial layer 34 by the thickness of layer 46, except for a small portion immediately adjacent the N-P-N junction formed by areas 38, areas 36 and epitaxial layer 34, the capacitance CGD is greatly reduced and the speed of DMOS device 30 is greatly improved. Further, implant 44 provides a relatively low resistance to current for a substantial portion of the current path through DMOS device 30. Also, by spacing implant 44 from areas 36, or at least the heavily doped portions thereof, the breakdown voltage of DMOS device 30 is not effected. Because implant 44 and relatively thick layer 46 are formed with the same nitride layer 41, the entire process is relatively simple and self aligned to insure accurate placement of the described components. Thus, a new and improved method of producing high speed, low gate/drain capacitance DMOS devices is disclosed. Also, a new and improved method of producing high speed, low gate/drain capacitance DMOS devices with low ON resistance is disclosed which is incorporated without requiring additional masking or alignment steps.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

What is claimed is:

1. A method of producing high speed, low gate/drain capacitance DMOS devices, comprising the steps of:
   providing a substrate;
   forming a first layer of material having a first conductivity type on a surface of the substrate;
   forming a mask layer on the first layer, which mask layer defines at least a central opening therethrough;
   forming a relatively thick layer of insulating material generally through the central opening and on the first layer of material;
   removing the mask layer;
   forming a relatively thin layer of insulating material over the relatively thick layer of insulating material and the first layer of material;
   selectively forming a gate layer over a portion of the relatively thin layer of insulating material and in overlying relationship to the relatively thick layer of insulating material;
   diffusing first and second spaced apart areas of a second conductivity type, different than the first conductivity type, into the first layer, the first and second spaced apart areas being separated by the relatively thick layer of insulating material and positioned on opposite sides thereof; and
   diffusing first and second spaced apart areas of the first conductivity type into the first and second areas of the second conductivity type, the first and second spaced apart areas of the second conductivity type and the first and second spaced apart areas of the first conductivity type being positioned so that the relatively thin layer of insulating material and a portion of the gate layer overlie a portion of the first and second spaced apart areas of the second conductivity type and a portion of the first and second spaced apart areas of the first conductivity type.

2. A method of producing high speed, low gate/drain capacitance DMOS devices as claimed in claim 1 wherein the step of forming a mask layer includes the steps of depositing a layer of nitride over the first layer of material and patterning the layer of nitride to define an opening therethrough.

3. A method of producing high speed, low gate/drain capacitance DMOS devices as claimed in claim 2 including in addition the step of introducing an impurity through the opening into the first layer of material prior to the step of forming the relatively thick layer of insulating material.

4. A method of producing high speed, low gate/drain capacitance DMOS devices as claimed in claim 2 wherein the step of forming a relatively thick layer of insulating material includes growing a layer of field oxide with a thickness greater than approximately 1000 angstroms.

5. A method of producing high speed, low gate/drain capacitance DMOS devices, comprising the steps of:
   providing a silicon substrate;
   growing an epitaxial layer having a first conductivity type on a surface of the substrate;
   depositing a layer of nitride over the epitaxial layer;
   patterning the layer of nitride to define an opening therethrough;
   growing a relatively thick layer of field oxide on the epitaxial layer in the opening;
   removing the layer of nitride;

growing a relatively thin layer of gate oxide over the relatively thick layer of field oxide and the epitaxial layer;

selectively forming a gate layer over a portion of the relatively thin layer of gate oxide and in overlying relationship to the relatively thick layer of field oxide;

diffusing first and second spaced apart areas of a second conductivity type, different than the first conductivity type, into the epitaxial layer, the first and second spaced apart areas being separated by the relatively thick layer of insulating material and positioned on opposite sides thereof; and diffusing first and second spaced apart areas of the first conductivity type into the first and second areas of the second conductivity type to define channels in the first and second spaced apart areas of a second conductivity type, the first and second spaced apart areas of the second conductivity type and the first and second spaced apart areas of the first conductivity type being positioned so that a portion of the relatively thin layer of gate oxide and a portion of the gate layer overlie a portion of the first and second spaced apart areas of the second conductivity type including the channels.

6. A method of producing high speed, low gate/drain capacitance DMOS devices as claimed in claim 5 including in addition the step of implanting an impurity through the opening into the epitaxial layer prior to the step of growing the relatively thick layer of field oxide.

7. A method of producing high speed, low gate/drain capacitance DMOS devices as claimed in claim 5 wherein the step of growing a relatively thick layer of field oxide includes growing a layer of field oxide with a thickness greater than approximately 1000 angstroms.

* * * * *

UNITED STATES PATENT AND TRADEMARK OFFICE
CERTIFICATE OF CORRECTION

PATENT NO. : 5,273,922

DATED : December 28, 1993

INVENTOR(S) : Tsoi et al.

It is certified that error appears in the above-indentified patent and that said Letters Patent is hereby corrected as shown below:

Col. 6, claim 5, line 7, insert after "type", --"and a portion of the first and second spaced apart areas of the first conductivity type"--.

Signed and Sealed this

Eighteenth Day of October, 1994

Attest:

BRUCE LEHMAN

Attesting Officer

Commissioner of Patents and Trademarks